United States Patent
Fujita

(10) Patent No.: US 7,319,365 B2
(45) Date of Patent: Jan. 15, 2008

(54) SIGNAL DETERMINING APPARATUS INCLUDING AMPLIFIER CIRCUIT WITH VARIABLE RESPONSE SPEED

(75) Inventor: Yuji Fujita, Ohtsu (JP)

(73) Assignee: NEC Electronics Corporation, Kanagawa (JP)

( * ) Notice: Subject to any disclaimer, the term of this patent is extended or adjusted under 35 U.S.C. 154(b) by 130 days.

(21) Appl. No.: 11/213,808

(22) Filed: Aug. 30, 2005

(65) Prior Publication Data

US 2006/0044070 A1    Mar. 2, 2006

(30) Foreign Application Priority Data

Aug. 31, 2004  (JP)  ............... 2004-251303

(51) Int. Cl.
*H03F 3/08* (2006.01)

(52) U.S. Cl. ........................ 330/308; 330/51
(58) Field of Classification Search ............... 330/86, 330/110, 308, 51; 250/214 A, 214 AG
See application file for complete search history.

(56) References Cited

U.S. PATENT DOCUMENTS

| | | | |
|---|---|---|---|
| 5,278,700 A | 1/1994 | Sutliff et al. | 360/46 |
| 5,714,909 A * | 2/1998 | Jackson | 330/308 |
| 5,864,416 A | 1/1999 | Williams | 359/189 |
| 6,081,558 A | 6/2000 | North | 375/316 |
| 6,342,694 B1 * | 1/2002 | Satoh | 250/214 A |
| 6,956,439 B1 * | 10/2005 | Devnath | 330/308 |

FOREIGN PATENT DOCUMENTS

JP       2003-139608       5/2003

* cited by examiner

*Primary Examiner*—Khanh Van Nguyen
(74) *Attorney, Agent, or Firm*—Young & Thompson

(57) ABSTRACT

In a signal determining apparatus including an amplifier circuit adapted to receive and amplify an input signal to generate an output voltage, and a comparator adapted to compare the output voltage of the amplifier circuit with a reference voltage to generate an output signal, the amplifier circuit has variable response speed characteristics so that a response speed of the amplifier circuit is controlled during its amplifying operation.

16 Claims, 19 Drawing Sheets

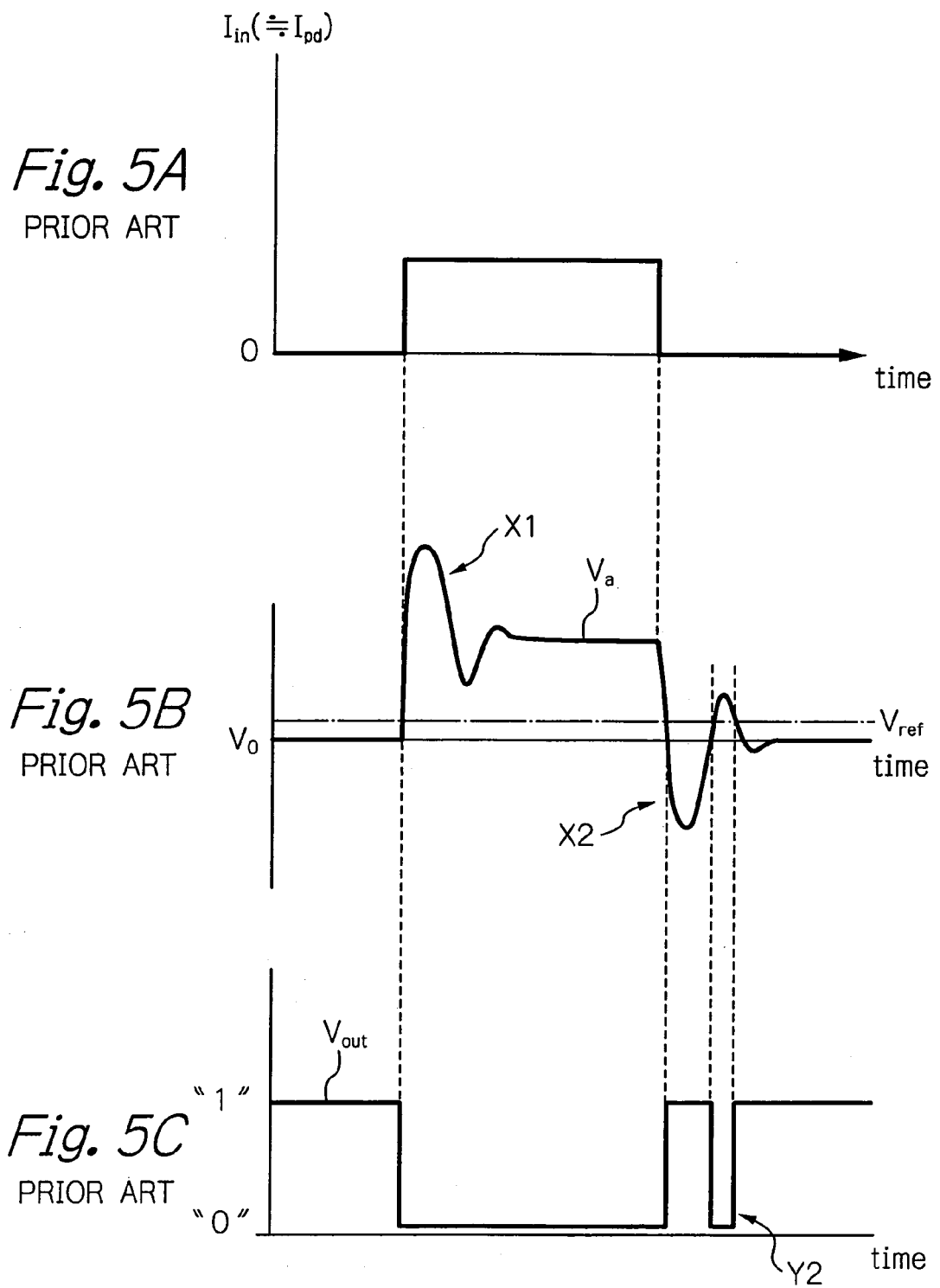

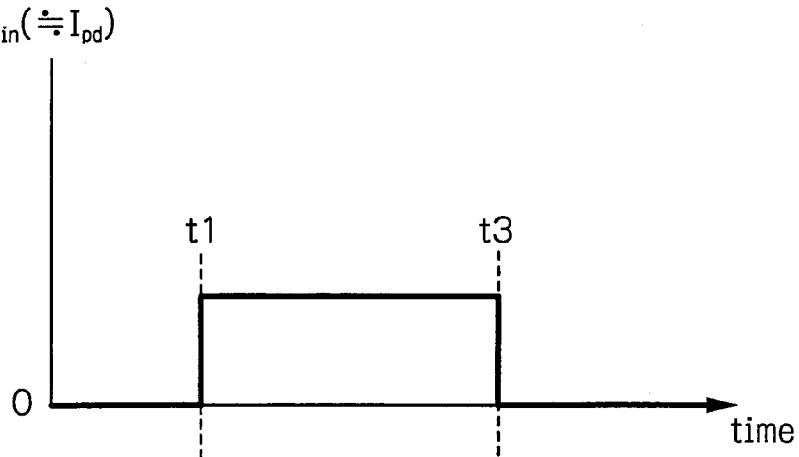
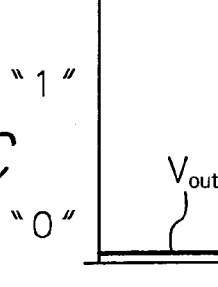
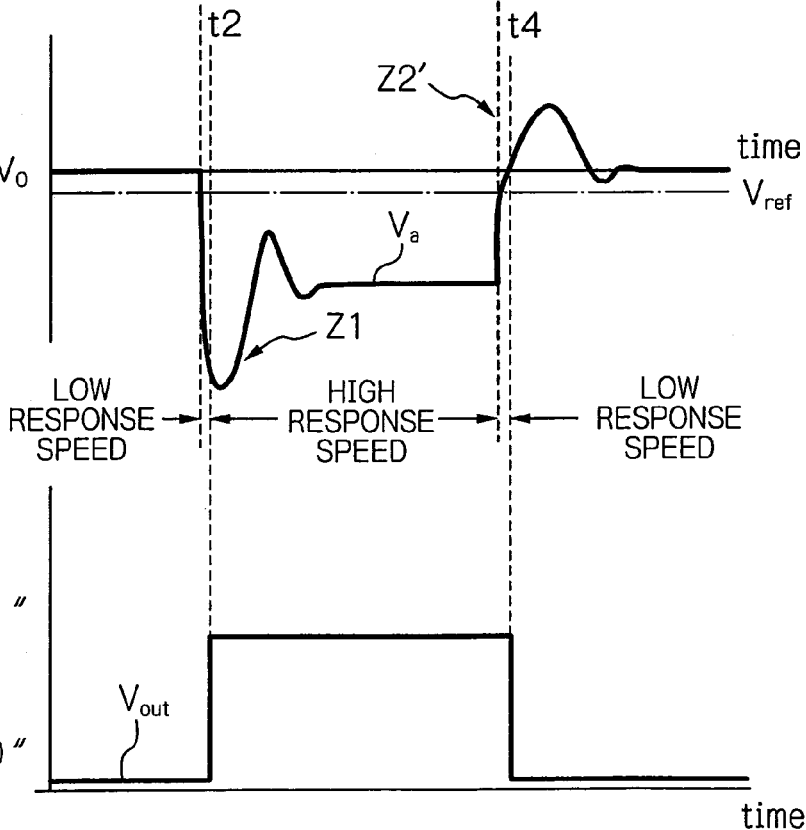

US 7,319,365 B2

SIGNAL DETERMINING APPARATUS INCLUDING AMPLIFIER CIRCUIT WITH VARIABLE RESPONSE SPEED

BACKGROUND OF THE INVENTION

1. Field of the Invention

The present invention relates to a signal determining apparatus for receiving and amplifying an input signal such as a photocurrent signal and comparing the amplified input signal with a reference voltage.

2. Description of the Related Art

Generally, in a signal determining apparatus, an amplifier circuit is provided to receive and amplify an input signal such as a photocurrent signal to generate an output voltage, and a comparator is provided to compare the output voltage of the amplifier circuit with a reference voltage to generate an output signal. In this case, a response speed of the amplifier is constant (see: JP-2003-139608-A). This will be explained later in detail.

In the above-described prior art signal determining apparatus, when the response speed is relatively low, since a so-called ringing phenomenon such as an overshoot phenomenon or an undershoot phenomenon hardly occurs in the output voltage of the amplifier circuit, spurious waveforms would not appear in the output voltage of the comparator. However, when the response speed is relatively high, since a so-called ringing phenomenon such as an overshoot phenomenon or an undershoot phenomenon occurs in the output voltage of the amplifier circuit, spurious waveforms would appear in the output voltage of the comparator. This would invite a malfunction.

SUMMARY OF THE INVENTION

It is an object of the present invention to provide a signal determining apparatus including an amplifier circuit operable at high response speed, capable of suppressing the generation of spurious waveforms.

According to the present invention, in a signal determining apparatus including an amplifier circuit adapted to receive and amplify an input signal to generate an output voltage, and a comparator adapted to compare the output voltage of the amplifier circuit with a reference voltage to generate an output signal, the amplifier circuit has variable response speed characteristics so that a response speed of the amplifier circuit is changed during its amplifying operation.

BRIEF DESCRIPTION OF THE DRAWINGS

The present invention will be more clearly understood from the description set forth below, as compared with the prior art, with reference to the accompanying drawings, wherein:

FIGS. 5A, 5B and 5C are timing diagrams for explaining the operation of the signal determining apparatus of FIG. 1 where the response speed is relatively high and the reference voltage is relatively low;

FIGS. 16A, 16B and 16C are timing diagrams for explaining the operation of the signal determining apparatus of FIG. 15;

DESCRIPTION OF THE PREFERRED EMBODIMENTS

Before the description of the preferred embodiments, a prior art signal determining apparatus will be explained with reference to FIGS. 1, 2, 3A, 3B, 3C, 4A, 4B, 4C, 5A, 5B, 5C, 6A, 6B and 6C (see: JP-2003-139608-A).

Figure 1:
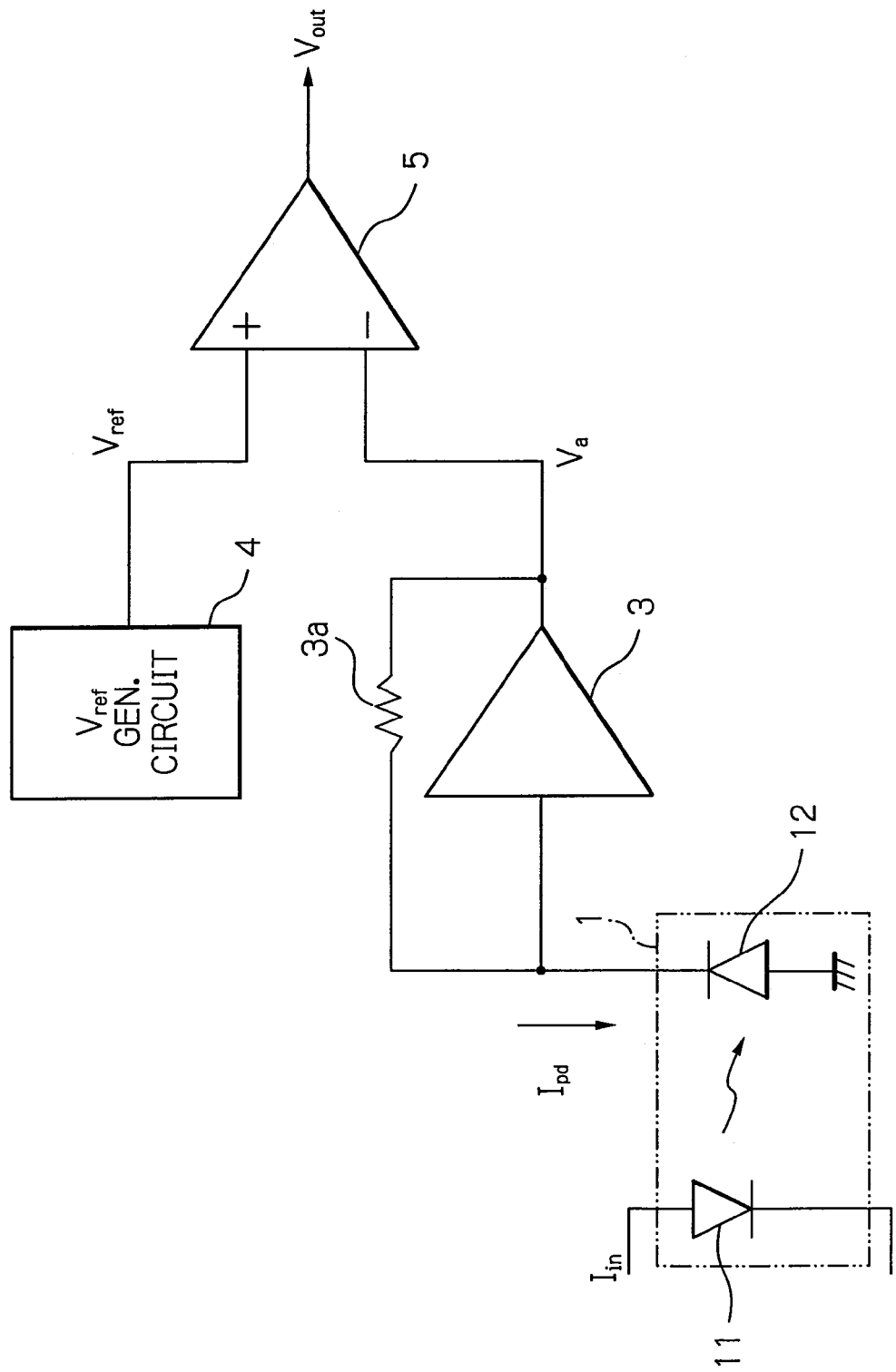
FIG. 1 is a circuit diagram illustrating a prior art signal determining apparatus.

In FIG. 1, which illustrates a prior art signal determining apparatus, a photocoupler 1 is constructed by a light emitting diode (LED) 11 and a photodiode 12. That is, when an input current $I_{in}$ is supplied to the LED 11, the LED 11 generates a light signal indicated by an arrow, so that the photodiode 12 receives the light signal so that a photocurrent $I_{pd}$ flows therethrough in response to the input current $I_{in}$.

The photocurrent $I_{pd}$ is amplified by an amplifier 3 with a negative feedback resistor 3a connected between the output and input thereof. The input of the amplifier 3 is connected to the cathode of the photodiode 121. The amplifier 3 generates an output voltage $V_a$ in response to the photocurrent $I_{pd}$. Note that the amplifier 3 generates a definite voltage $V_0$ when no photocurrent $I_{pd}$ flows.

The amplifier 3 and the feedback resistor 3a form an amplifier circuit.

On the other hand, a reference voltage generating circuit 4 generates a reference voltage $V_{ref}$. In this case, $V_{ref} > V_0$, and $V_{ref} < V_a$ when the photocurrent $I_{pd}$ flows. The output voltage $V_a$ of the amplifier 3 and the reference voltage $V_{ref}$ of the reference voltage generating circuit 4 are supplied to inverting and non-inverting inputs, respectively, of a comparator 5. Therefore, when $V_a \leq V_{ref}$, the output signal $V_{out}$ of the comparator is high (="1"). On the other hand, when $V_a > V_{ref}$, the output signal $V_{out}$ of the comparator is low (="0").

Figure 2:
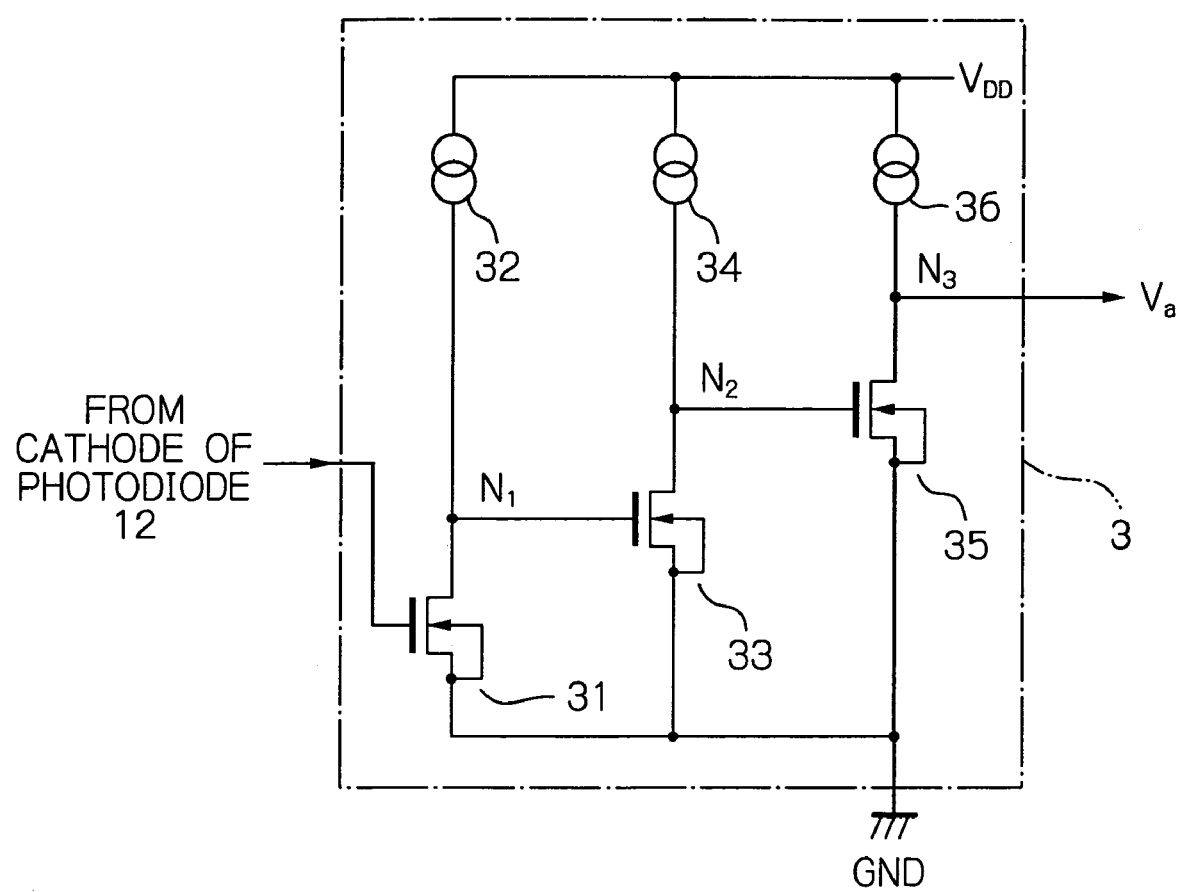
FIG. 2 is a detailed circuit diagram of the amplifier of FIG. 1.

In FIG. 2, which is a detailed circuit diagram of the amplifier 3 of FIG. 1, first, second and third amplifier stages are serially-connected. That is, the first amplifier stage is constructed by an N-channel MOS transistor 31 with a grounded source and a gate connected to the cathode of the photodiode 12, and a current source 32 connected between the drain of the MOS transistor 31 and a power supply terminal $V_{DD}$. In this case, a node $N_1$ between the drain of the MOS transistor 31 and the current source 32 serves as an output node of the first amplifier stage. Also, the second amplifier stage is constructed by an N-channel MOS transistor 33 with a grounded source and a gate connected to the node $N_1$, and a current source 34 connected between the drain of the MOS transistor 33 and the power supply terminal $V_{DD}$. In this case, a node $N_2$ between the drain of the MOS transistor 33 and the current source 34 serves as an output node of the second amplifier stage. Further, the third amplifier stage is constructed by an N-channel MOS transistor 33 with a grounded source and a gate connected to the node $N_2$, and a current source 36 connected between the drain of the MOS transistor 35 and the power supply terminal $V_{DD}$. In this case, a node $N_3$ between the drain of the MOS transistor 35 and the current source 36 serves as an output node of the third amplifier stage, i.e., the output of the amplifier 3.

Note that the above-mentioned definite voltage $V_0$ is determined by a threshold voltage of the MOS transistor 31.

In FIG. 1, when there is no input current $I_{in}$, there is no photocurrent $I_{pd}$. As a result, the output voltage $V_a$ of the amplifier 3 is made to be $V_0$, so that $V_a = V_0 < V_{ref}$. Therefore, the output voltage $V_{out}$ of the comparator 5 is made to be high (="1"). On the other hand, when an input current $I_{in}$, i.e., a photocurrent $I_{pd}$ flows, the output voltage $V_a$ of the amplifier 3 is made to be higher than $V_{ref}$, i.e., $$V_a = V_0 + I_{pd} \cdot R_f > V_{ref}$$

where $R_f$ is a resistance value of the feedback resistor 3a, the output voltage $V_{out}$ of the comparator 5 is made to be low (="0").

Thus, the output signal $V_{out}$ of the comparator 5 is "1" or "0" in accordance with the photocurrent $I_{pd}$, i.e. the input current $I_{in}$.

The operation of the signal determining apparatus of FIG. 1, where the response speed is relatively low and the reference voltage $V_{ref}$ is relatively low ($V_{ref} \approx V_0$), will be explained next with reference to FIGS. 3A, 3B and 3C.

Figure 3A:
FIGS. 3A, 3B and 3C are timing diagrams for explaining the operation of the signal determining apparatus of FIG. 1 where the response speed is relatively low and the reference voltage is relatively low.
Figure 3B:
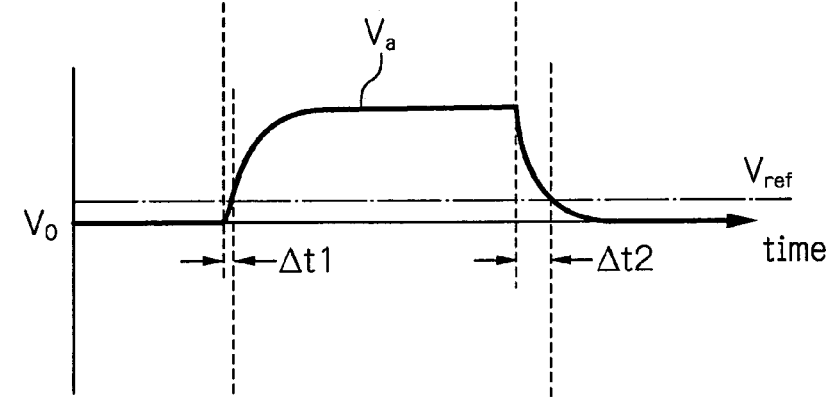
Figure 3C:
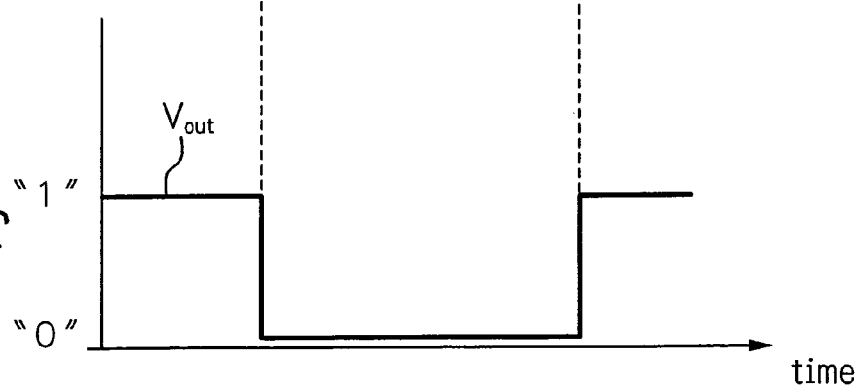

When the input current $I_{in}$ (or the photocurrent $I_{pd}$) is changed as illustrated in FIG. 3A, the output voltage $V_a$ of the amplifier 3 is gradually changed as illustrated in FIG. 3B. As a result, the output voltage $V_{out}$ of the comparator 5 is changed with delay times $\Delta t1$ and $\Delta t2$ as illustrated in FIG. 3C. In this case, since $V_{ref}$ is relatively low, $\Delta t1 < \Delta t2$.

The operation of the signal determining apparatus of FIG. 1, where the response speed is relatively low and the reference voltage $V_{ref}$ is relatively high ($V_{ref} >> V_0$), will be explained next with reference to FIGS. 4A, 4B and 4C.

Figure 4A:
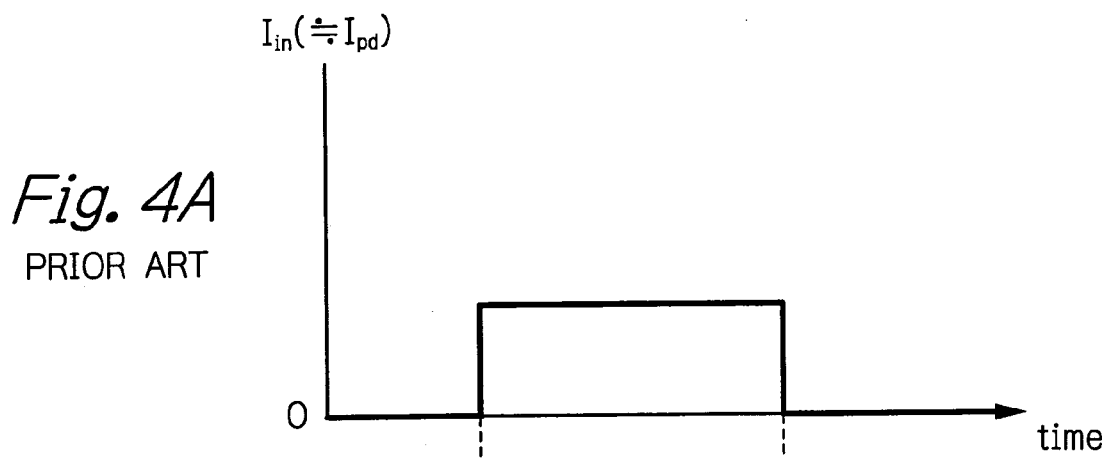
FIGS. 4A, 4B and 4C are timing diagrams for explaining the operation of the signal determining apparatus of FIG. 1 where the response speed is relatively low and the reference voltage is relatively high.
Figure 4B:
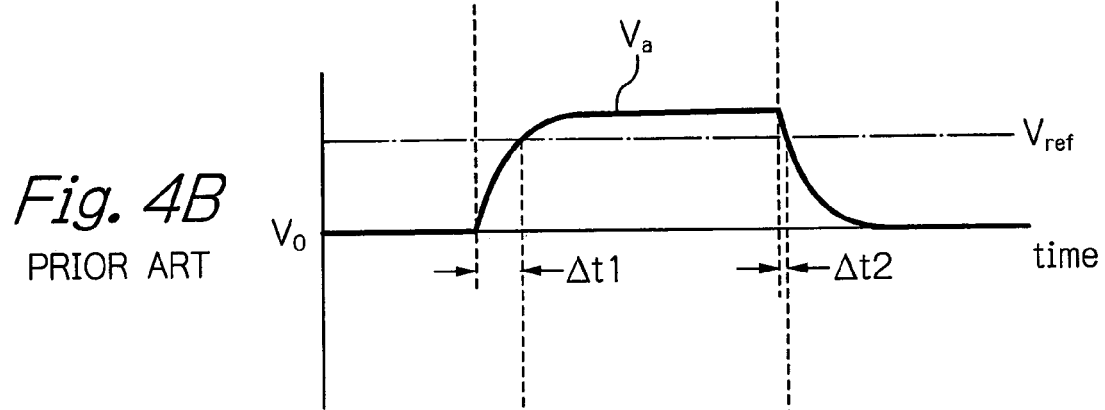
Figure 4C:
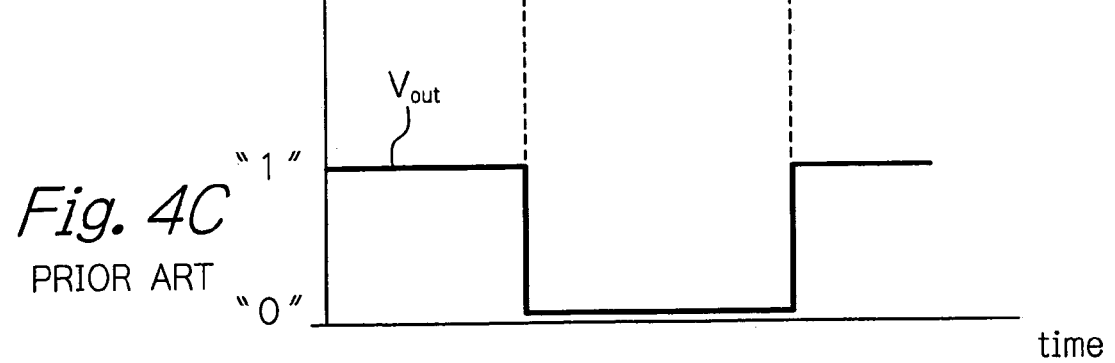

When the input current in (or the photocurrent $I_{pd}$) is changed as illustrated in FIG. 4A, the output voltage $V_a$ of the amplifier 3 is gradually changed as illustrated in FIG. 4B. As a result, the output voltage $V_{out}$ of the comparator 5 is changed with delay times $\Delta t1$ and $\Delta t2$ as illustrated in FIG. 4C. In this case, since $V_{ref}$ is relatively high, $\Delta t1 > \Delta t2$.

In FIGS. 3A, 3B and 3C and FIGS. 4A, 4B and 4C, since a so-called ringing phenomenon such as an overshoot phenomenon or an undershoot phenomenon hardly occurs in the output voltage $V_a$ of the amplifier 3, spurious waveforms would not appear in the output voltage $V_{out}$ of the comparator 5.

The operation of the signal determining apparatus of FIG. 1, where the response speed is relatively high and the reference voltage $V_{ref}$ is relatively low ($V_{ref} \approx V_0$), will be explained next with reference to FIGS. 5A, 5B and 5C.

When the input current $I_{in}$ (or the photocurrent $I_{pd}$) is changed as illustrated in FIG. 5A, the output voltage $V_a$ of the amplifier 3 is rapidly changed as illustrated in FIG. 5B. As a result, when the output voltage $V_a$ of the amplifier 3 rises, an overshoot phenomenon as indicated by X1 in FIG. 5B appears therein. Similarly, when the output voltage $V_a$ of the amplifier 3 falls, an undershoot phenomenon as indicated by X2 in FIG. 5B appears therein. Therefore, since the reference voltage $V_{ref}$ is relatively low, the output signal $V_{out}$ of the comparator 5 is hardly affected by the overshoot phenomenon X1; however, the output signal $V_{out}$ of the comparator 5 is strongly affected by the undershoot phenomenon X2, so that the output signal $V_{out}$ of the comparator 5 chatters to generate spurious waveforms as indicated by Y2 in FIG. 5C.

The operation of the signal determining apparatus of FIG. 1, where the response speed is relatively high and the reference voltage $V_{ref}$ is relatively high, will be explained next with reference to FIGS. 6A, 6B and 6C.

Figure 6A:
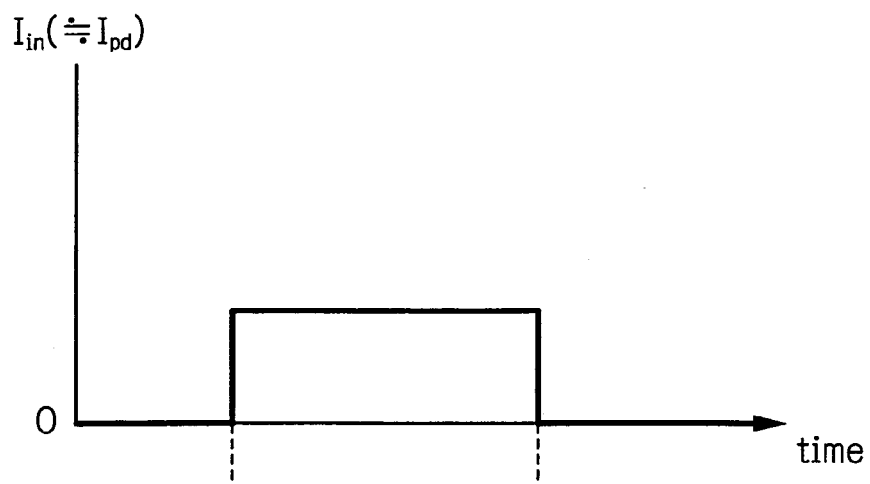
FIGS. 6A, 6B and 6C are timing diagrams for explaining the operation of the signal determining apparatus of FIG. 1 where the response speed is relatively high and the reference voltage is relatively high.
Figure 6B:
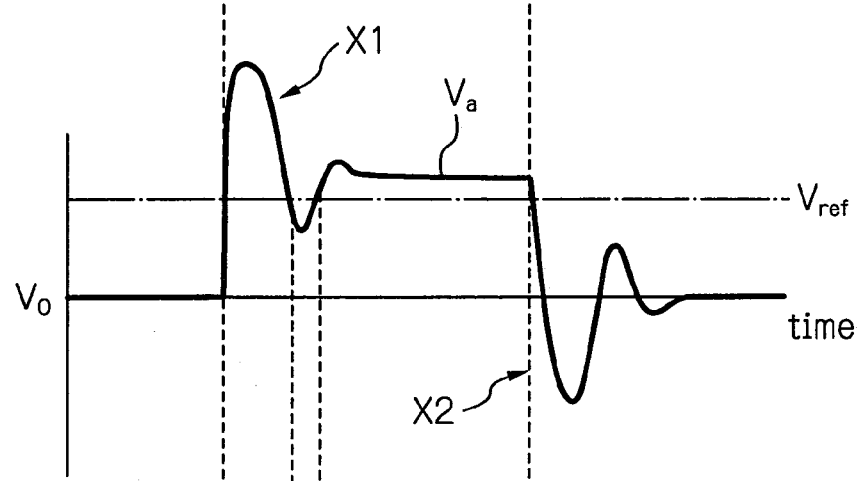
Figure 6C:
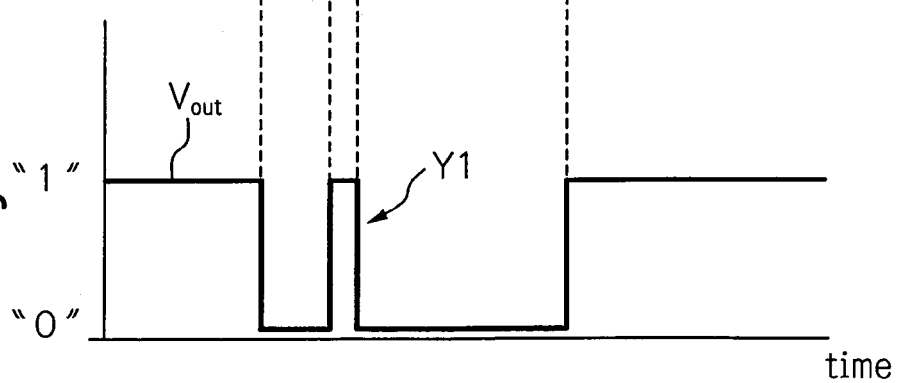

When the input current $I_{in}$ (or the photocurrent $I_{pd}$) is changed as illustrated in FIG. 6A, the output voltage $V_a$ of the amplifier 3 is rapidly changed as illustrated in FIG. 6B. As a result, when the output voltage $V_a$ of the amplifier 3 rises, an overshoot phenomenon as indicated by X1 in FIG. 6B appears therein. Similarly, when the output voltage $V_a$ of the amplifier 3 falls, an undershoot phenomenon as indicated by X2 in FIG. 6B appears therein. Therefore, since the reference voltage $V_{ref}$ is relatively high, the output signal $V_{out}$ of the comparator 5 is hardly affected by the undershoot phenomenon X2; however, the output signal $V_{out}$ of the comparator 5 is strongly affected by the overshoot phenomenon X1, so that the output signal $V_{out}$ of the comparator 5 chatters to generate spurious waveforms as indicated by Y1 in FIG. 6C.

In FIGS. 5A, 5B and 5C and FIGS. 6A, 6B and 6C, since a so-called ringing phenomenon such as an overshoot phenomenon or an undershoot phenomenon occurs in the output voltage $V_a$ of the amplifier 3, spurious waveforms would appear in the output voltage $V_{out}$ of the comparator 5.

Figure 7:
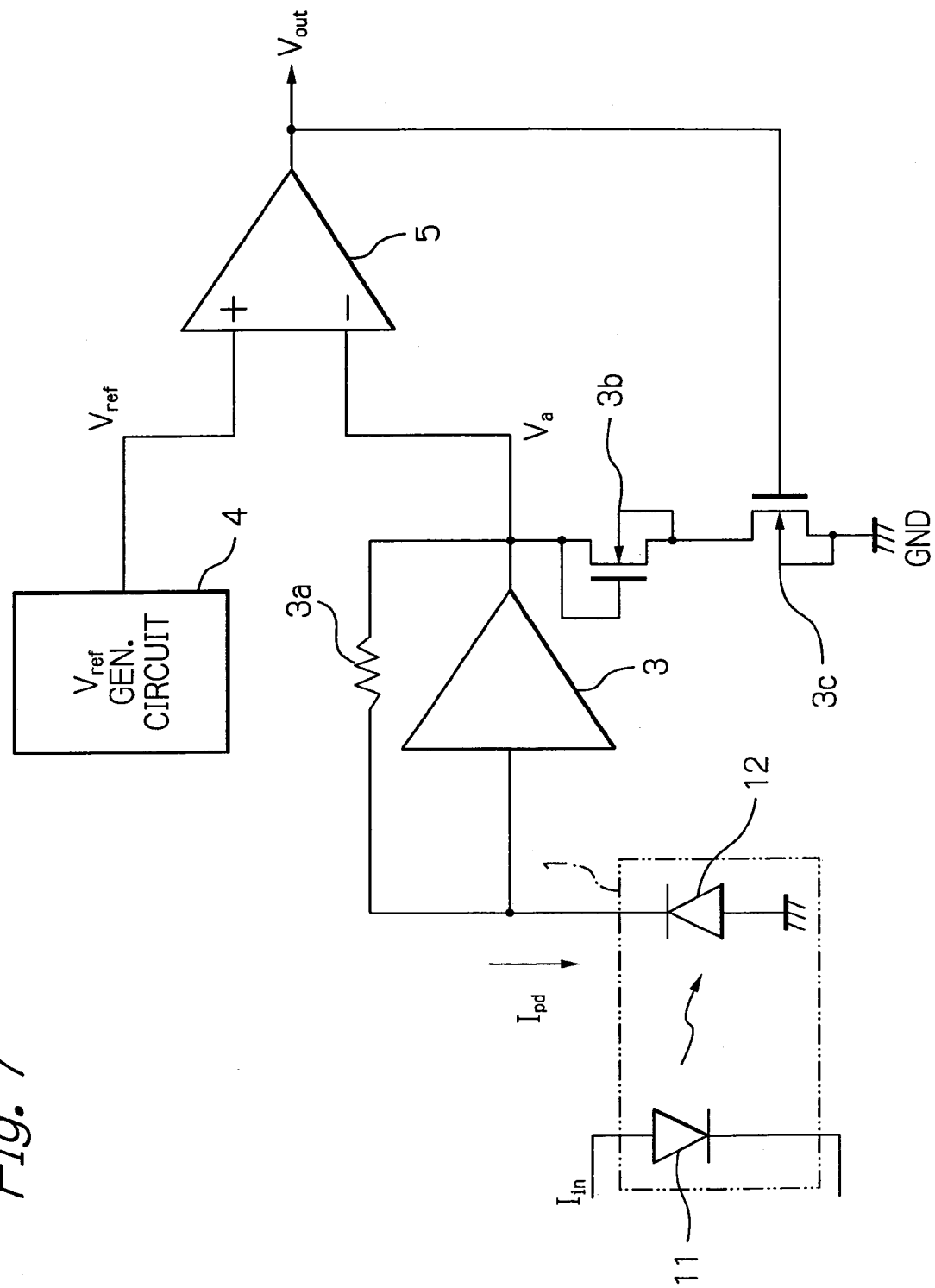
FIG. 7 is a circuit diagram illustrating a first embodiment of the signal determining apparatus according to the present invention.

In FIG. 7, which illustrates a first embodiment of the signal determining apparatus according to the present invention, a drain-to-gate connected N-channel MOS transistor 3b serving as a load and an N-channel MOS transistor 3c serving as a switching element controlled by the output voltage $V_{out}$ of the comparator 5 are connected in series between the output of the amplifier 3 and the ground terminal GND. That is, when the output voltage $V_{out}$ of the comparator 5 is low (="0"), the switching MOS transistor 3c is turned OFF to disconnect the load MOS transistor 3b from the amplifier 3, so that the amplifier 3 can operate at a high response speed. On the other hand, when the output voltage $V_{out}$ of the comparator 5 is high (="1"), the switching MOS transistor 3c is turned ON to connect the load MOS transistor 3b to the amplifier 3, so that the amplifier 3 can operate at a low response speed.

The amplifier 3, the feedback resistor 3a, the load MOS transistor 3b and the switching MOS transistor 3c form an amplifier circuit.

In FIG. 7, assume that the reference voltage $V_{ref}$ is relatively low, i.e., $V_{ref} \approx V_0$.

The operation of the signal determining apparatus of FIG. 7 will be explained next with reference to FIGS. 8A, 8B and 8C.

Figure 8A:
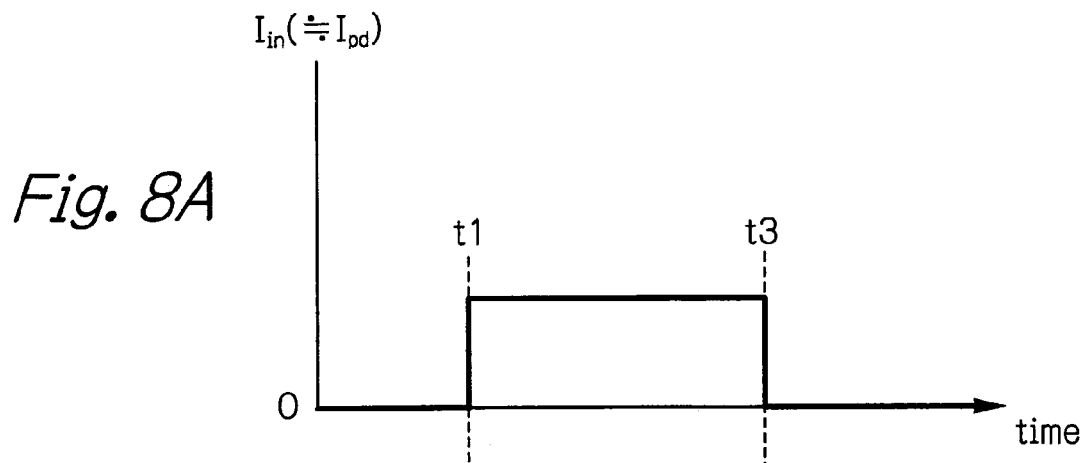
FIGS. 8A, 8B and 8C are timing diagrams for explaining the operation of the signal determining apparatus of FIG. 7.
Figure 8B:
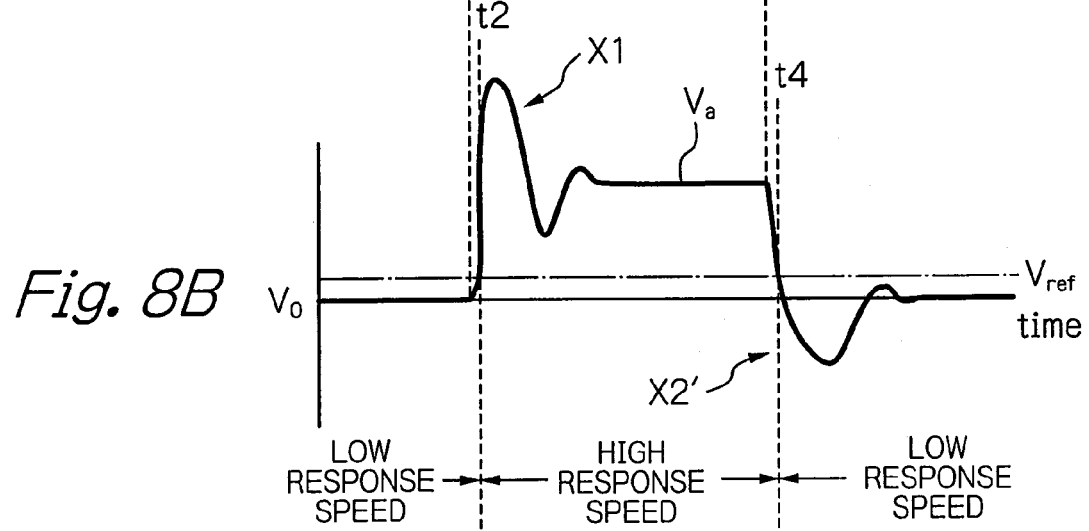
Figure 8C:
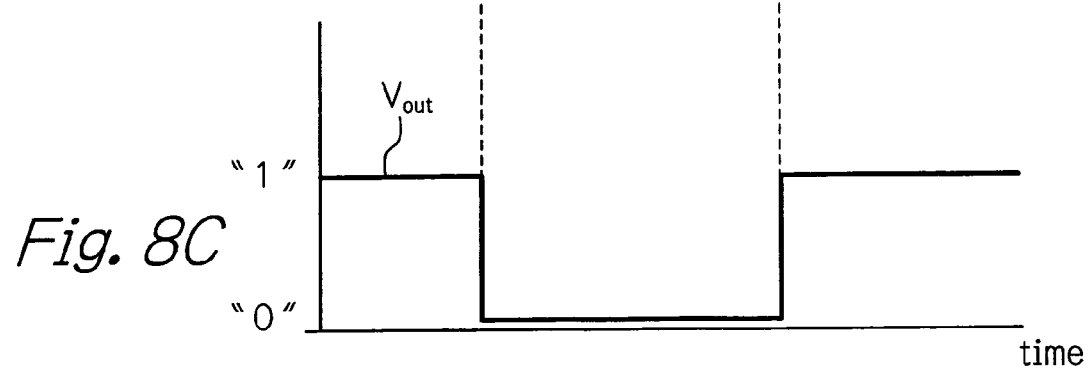

When the input current $I_{in}$ (or the photocurrent $I_{pd}$) is changed as illustrated in FIG. 8A, the output voltage $V_a$ of the amplifier 3 is changed as illustrated in FIG. 8B, and the output voltage $V_{out}$ of the comparator 5 is changed as illustrated in FIG. 8C.

In more detail, before time t1, the input current $I_{in}$ (the photocurrent $I_{pd}$) is zero, so that the output voltage $V_a$ of the amplifier 3 is $V_0$. In this case, the output voltage $V_{out}$ of the comparator 5 is high (="1"), so that the switching MOS transistor 3c is turned ON. Therefore, the amplifier 3 with the load MOS transistor 3b can operate at a low response speed.

At time t1, the input current $I_{in}$ (the photocurrent $I_{pd}$) rises to increase the output voltage $V_a$ of the amplifier 3.

Next, at time t2, the output voltage $V_a$ of the amplifier 3 reaches the reference voltage $V_{ref}$, so that the output voltage $V_{out}$ of the comparator 5 is switched from high (="1") to low (="0"). As a result, the switching MOS transistor 3c is turned OFF, so that the amplifier 3 without the load MOS transistor 3b can operate at a high response speed. In this case, although an overshoot phenomenon as indicated by X1 in FIG. 8B in the same way as in FIG. 5B appears in the output voltage $V_a$ of the amplifier 3, this overshoot phenomenon X1 does not affect the output voltage $V_{out}$ of the comparator 5 due to the low reference voltage $V_{ref}$.

Next, at time t3, the input current $I_{in}$ (the photocurrent $I_{pd}$) falls to decrease the output voltage $V_a$ of the amplifier 3.

Next, at time t4, the output voltage $V_a$ of the amplifier 3 reaches the reference voltage $V_{ref}$, so that the output voltage $V_{out}$ of the comparator 5 is switched from low (="0") to high (="1"). As a result, the switching MOS transistor 3c is turned ON, so that the amplifier 3 with the load MOS transistor 3b can operate at a low response speed. Even in this case, an undershoot phenomenon as indicated by X2' appears in the output voltage $V_a$ of the amplifier 3; however, this undershoot phenomenon X2' is milder than the undershoot phenomenon X2 in FIG. 5B due to the low response speed of the amplifier 3. Therefore, this undershoot phenomenon X2' in FIG. 8B does not affect the output voltage $V_{out}$ of the comparator 5.

Figure 9:
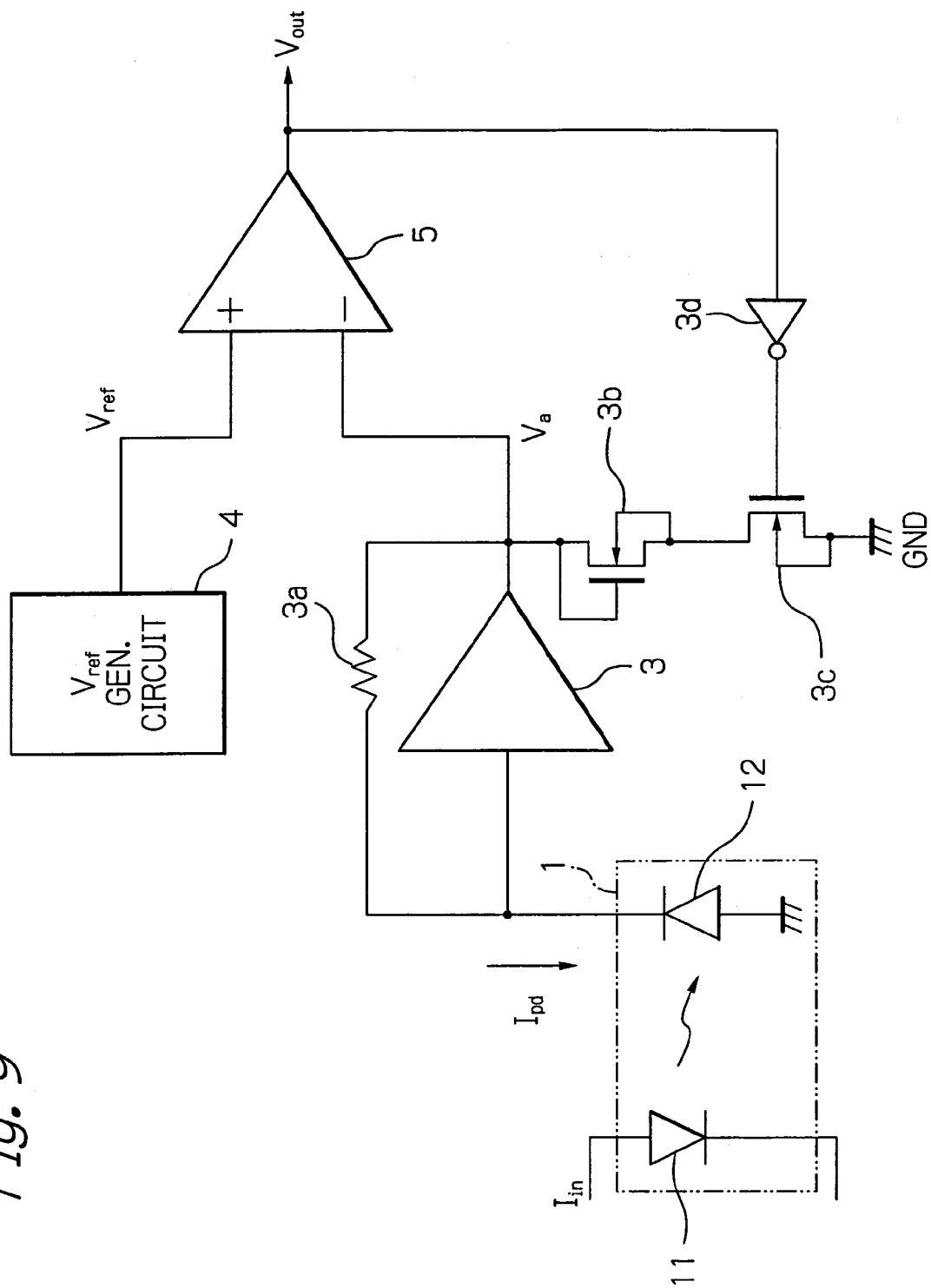
FIG. 9 is a circuit diagram illustrating a second embodiment of the signal determining apparatus according to the present invention.

In FIG. 9, which illustrates a second embodiment of the signal determining apparatus according to the present invention, an inverter 3d is connected between the output of the comparator 5 and the gate of the switching MOS transistor 3c of FIG. 7. That is, when the output voltage $V_{out}$ of the comparator 5 is high (="1"), the switching MOS transistor 3c is turned OFF to disconnect the load MOS transistor 3b from the amplifier 3, so that the amplifier 3 without the load MOS transistor 3b can operate at a high response speed. On the other hand, when the output voltage $V_{out}$ of the comparator 5 is low (="0"), the switching MOS transistor 3c is turned ON to connect the load MOS transistor 3b to the amplifier 3, so that the amplifier 3 with the load MOS transistor 3b can operate at a low response speed.

In FIG. 9, assume that the reference voltage $V_{ref}$ is relatively high, i.e., $V_{ref} >> V_0$.

The operation of the signal determining apparatus of FIG. 9 will be explained next with reference to FIGS. 10A, 10B and 10C.

Figure 10A:
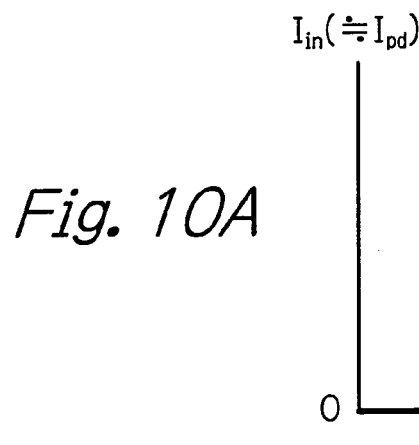
FIGS. 10A, 10B and 10C are timing diagrams for explaining the operation of the signal determining apparatus of FIG. 9.
Figure 10B:
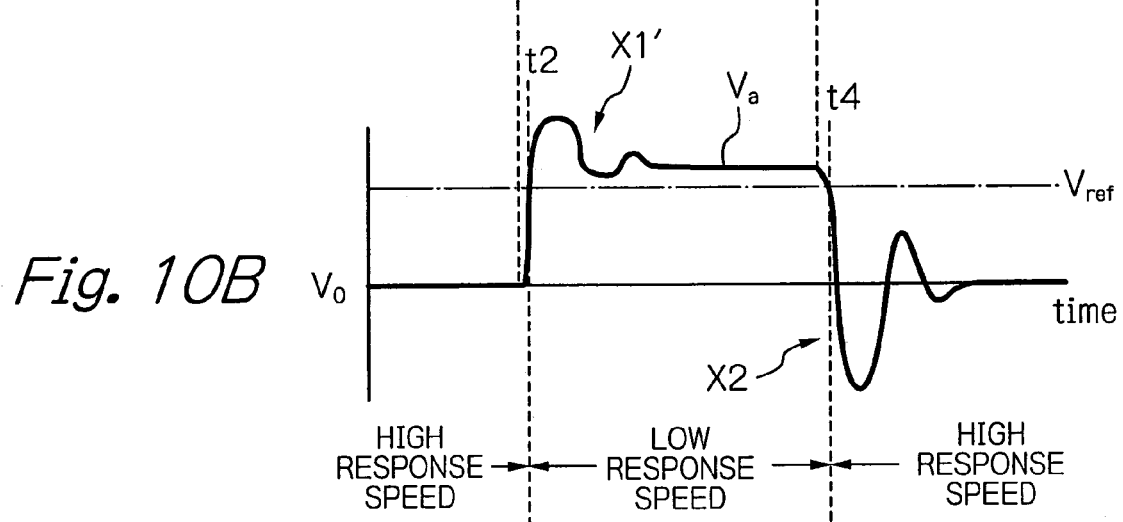
Figure 10C:
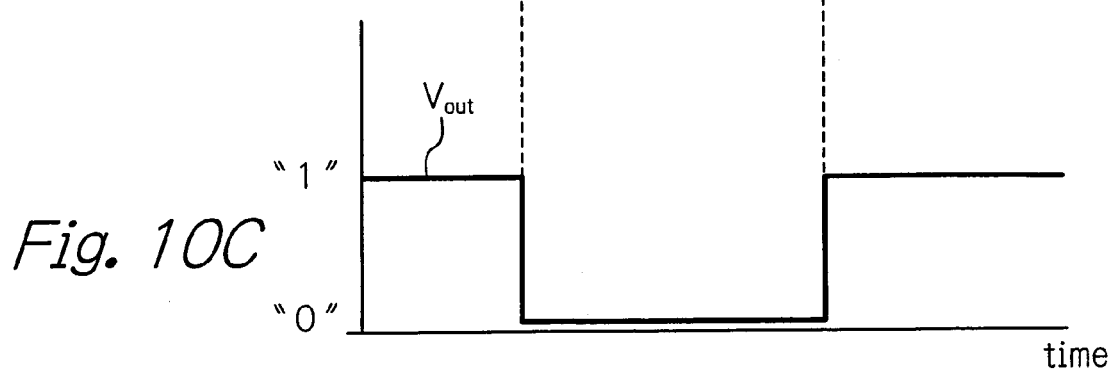

When the input current $I_{in}$ (or the photocurrent $I_{pd}$) is changed as illustrated in FIG. 10A, the output voltage $V_a$ of the amplifier 3 is changed as illustrated in FIG. 10B, and the output voltage $V_{out}$ of the comparator 5 is changed as illustrated in FIG. 10C.

In more detail, before time t1, the input current $I_{in}$ (the photocurrent $I_{pd}$) is zero, so that the output voltage $V_a$ of the amplifier 3 is $V_0$. In this case, the output voltage $V_{out}$ of the comparator 5 is high (="1"), so that the switching MOS transistor 3c is turned OFF. Therefore, the amplifier 3 without the load MOS transistor 3b can operate at a high response speed.

At time t1, the input current $I_{in}$ (the photocurrent $I_{pd}$) rises to increase the output voltage $V_a$ of the amplifier 3.

Next, at time t2, the output voltage $V_a$ of the amplifier 3 reaches the reference voltage $V_{ref}$, so that the output voltage $V_{out}$ of the comparator 5 is switched from high (="1") to low (="0"). As a result, the switching MOS transistor 3c is turned ON, so that Fi the amplifier 3 with the load MOS transistor 3b can operate at a low response speed. Even in this case, although an overshoot phenomenon as indicated by X1' in FIG. 10B appears in the output voltage $V_a$ of the amplifier 3, this overshoot phenomenon X1' is milder than the overshoot phenomenon X1 in FIG. 6B due to the low response speed of the amplifier 3. Therefore, this overshoot phenomenon X1' does not affect the output voltage $V_{out}$ of the comparator 5.

Next, at time t3, the input current $I_{in}$ (the photocurrent $I_{pd}$) falls to decrease the output voltage $V_a$ of the amplifier 3.

Next, at time t4, the output voltage $V_a$ of the amplifier 3 reaches the reference voltage $V_{ref}$, so that the output voltage $V_{out}$ of the comparator 5 is switched from low (="0") to high (="1"). As a result, the switching MOS transistor 3c is turned OFF, so that the amplifier 3 without the load MOS transistor 3b can operate at a high response speed. In this case, although an undershoot phenomenon as indicated by X2 in FIG. 10B in the same way as in FIG. 6B appears in the output voltage $V_a$ of the amplifier 3, this undershoot phenomenon X2 does not affect the output voltage $V_{out}$ of the comparator 5 due to the high reference voltage $V_{ref}$.

Figure 11:
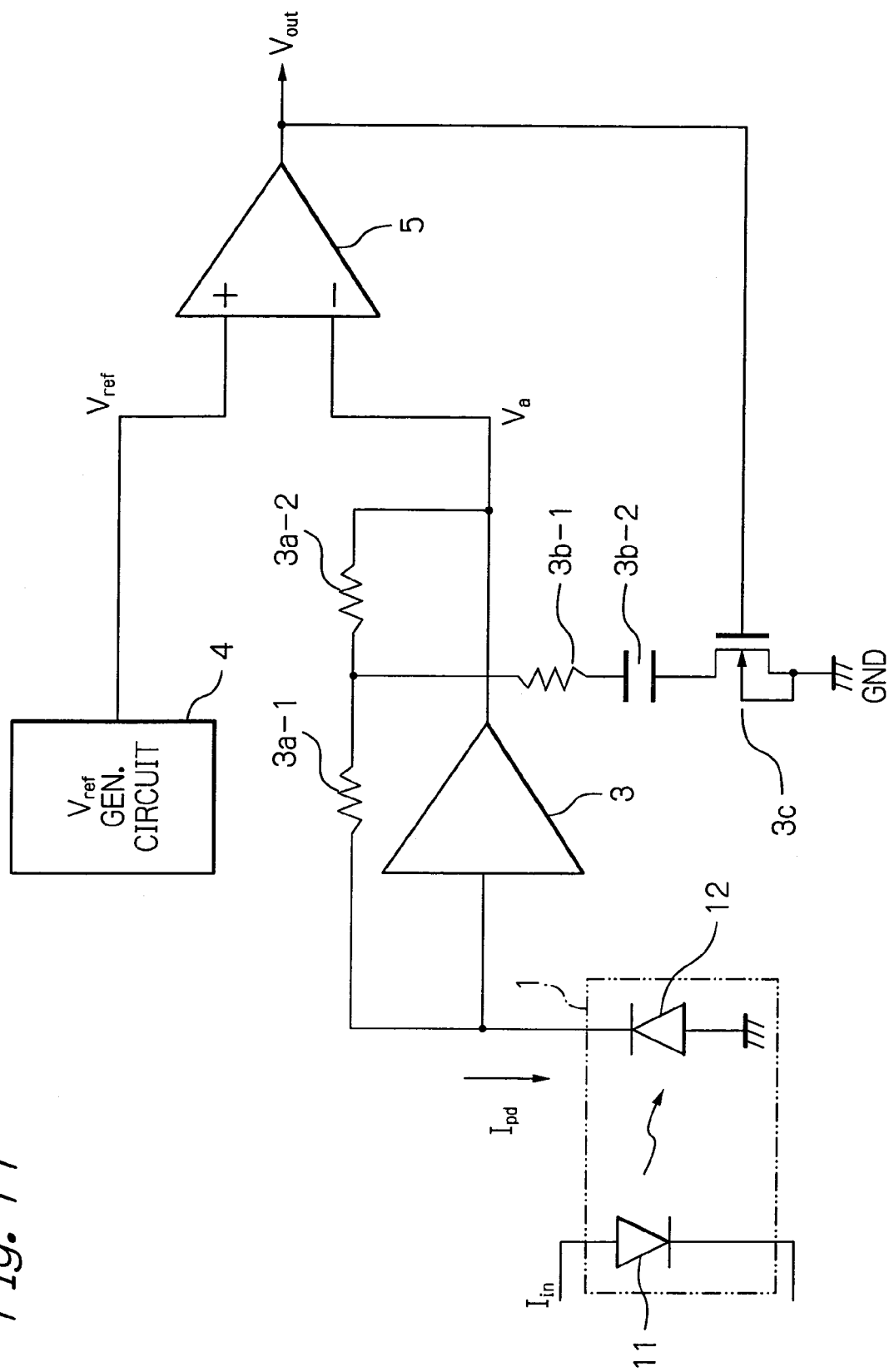
FIGS. 11 and 12 are circuit diagrams illustrating modifications of the signal determining apparatuses of FIGS. 7 and 9, respectively.
Figure 12:
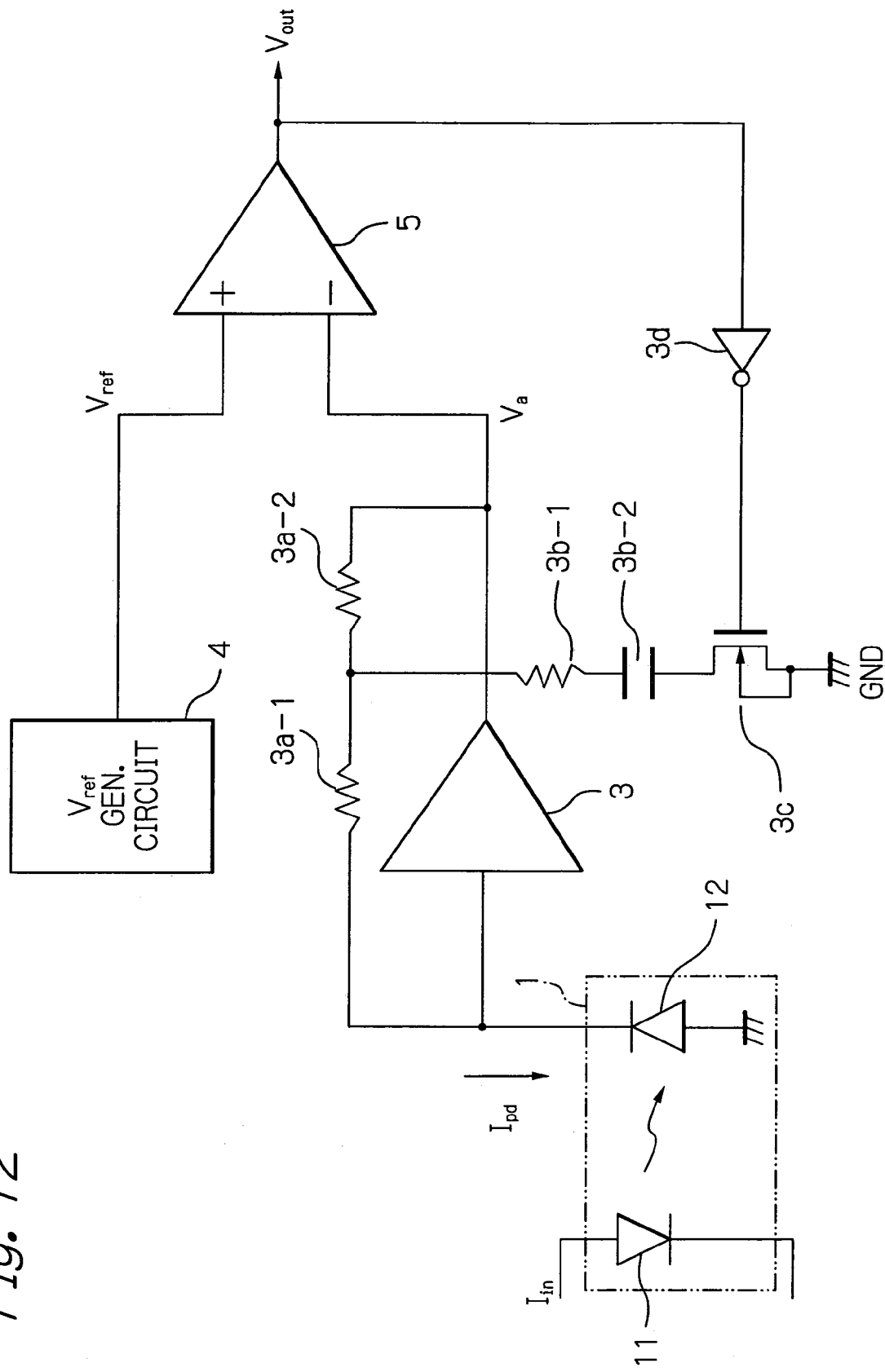

The signal determining apparatuses of FIGS. 7 and 9 can be modified to those of FIGS. 11 and 12, respectively. In FIGS. 11 and 12, the feedback resistor 3a of FIGS. 7 and 9 is replaced by a series of two resistors 3a-1 and 3a-2, and the load MOS transistor 3b of FIGS. 7 and 9 is replaced by a series of a resistor 3b-1 and a capacitor 3b-2. Also, the series of the resistor 3b-1 and the capacitor 3b-2 is connected to a node between the resistors 3a-1 and 3a-2. In FIGS. 11 and 12, a DC component never flows through the series of the resistor 3b-1 and the capacitor 3b-2, which would decrease the power consumption as compared with the signal determining apparatuses of FIGS. 7 and 9.

Note that the location of the node between the resistors 3a-1 and 3a-2 can be adjusted in consideration of a ringing phenomenon such as an overshoot phenomenon and an undershoot phenomenon in the output voltage $V_8$ of the amplifier 3.

Figure 13:
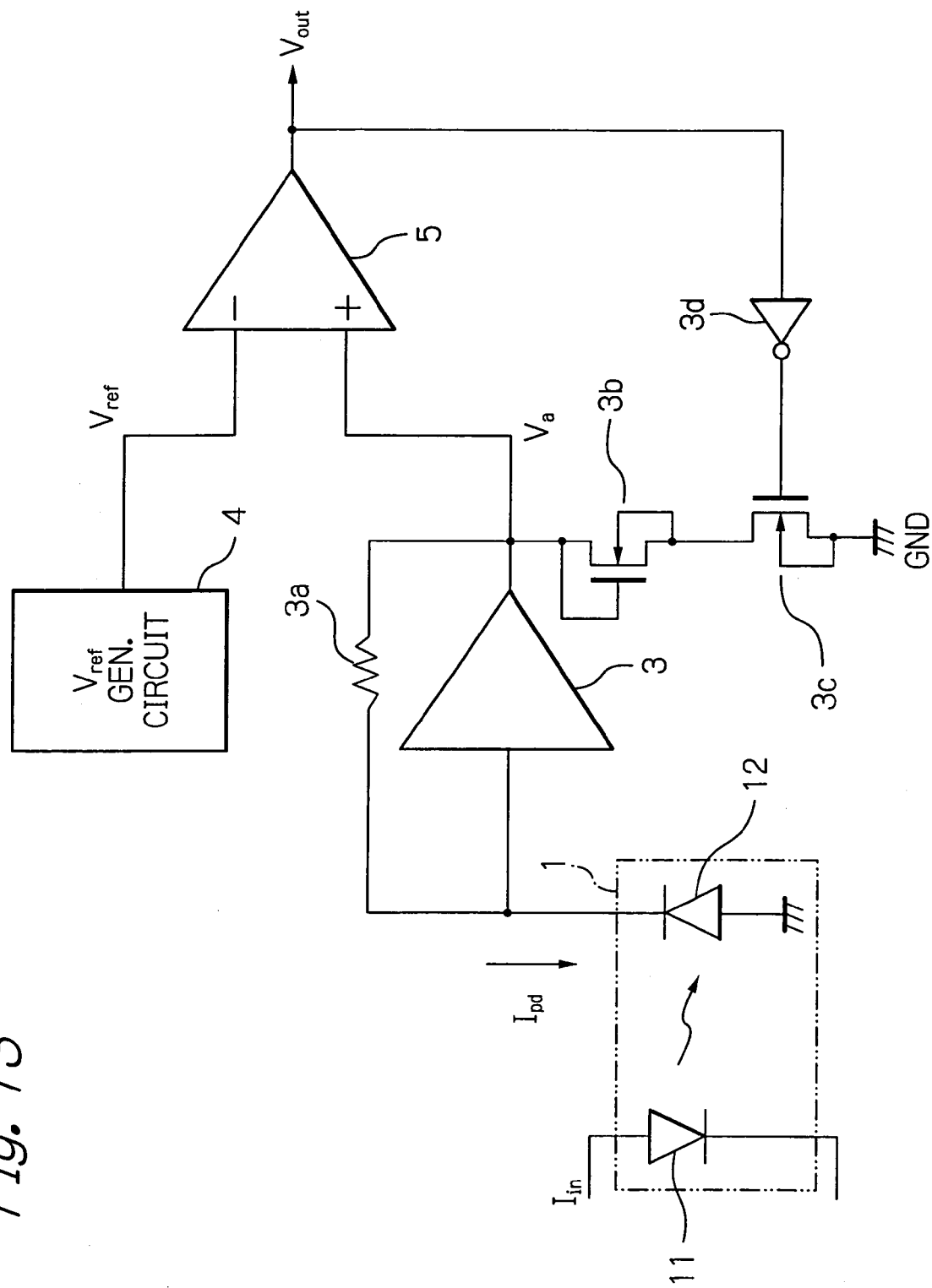
FIGS. 13 and 14 are circuit diagrams illustrating other modifications of the signal determining apparatuses of FIGS. 7 and 9, respectively.
Figure 14:
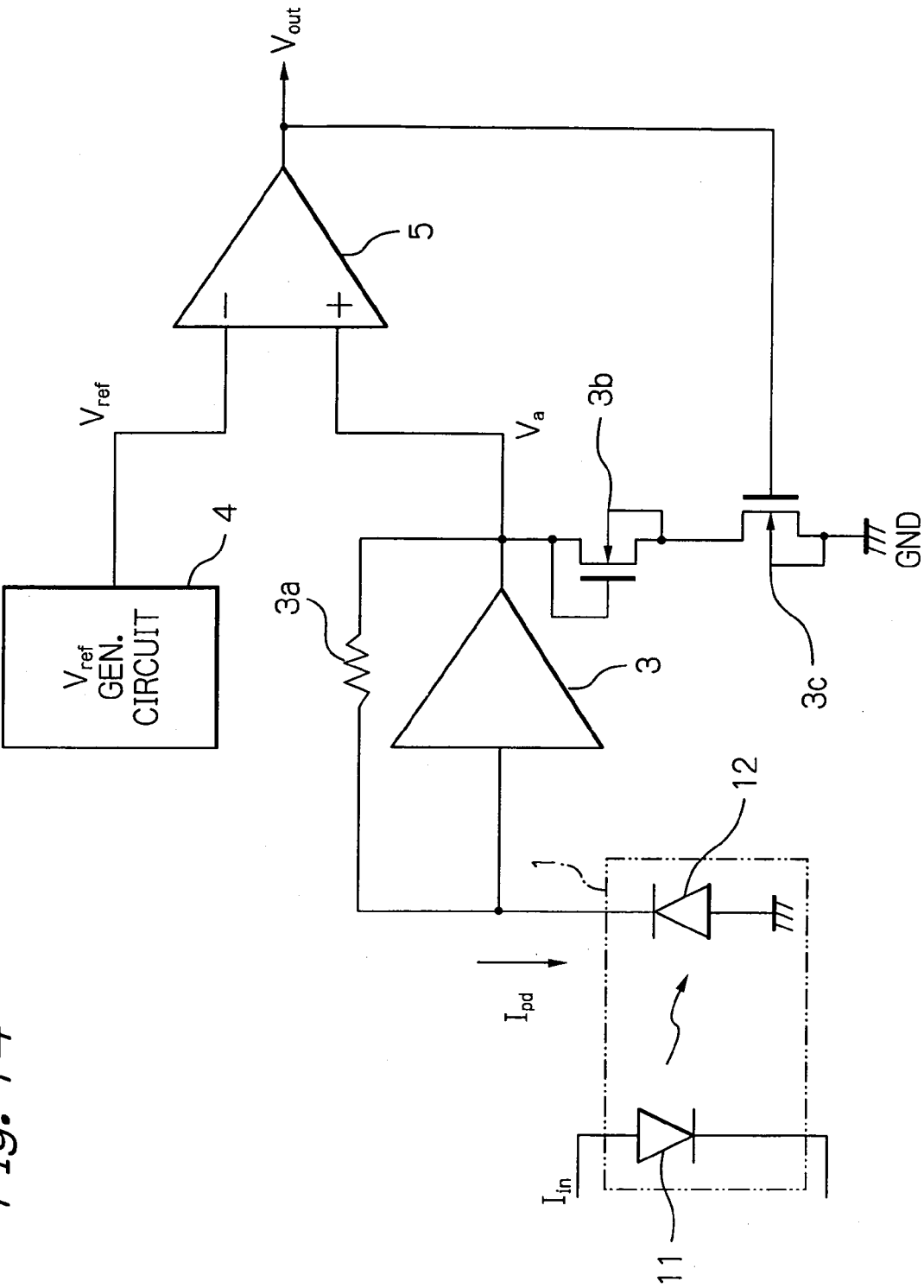

Additionally, the signal determining apparatuses of FIGS. 7 and 9 can be modified to those of FIGS. 13 and 14, respectively. In FIGS. 13 and 14, the input polarities of the comparator 5 are opposite to those of FIGS. 7 and 9. In FIG. 13, the inverter 3d is added to the elements of the signal determining apparatus of FIG. 7. On the other hand, in FIG. 14, the inverter 3d is deleted from the elements of the signal determining apparatus of FIG. 9.

Figure 15:
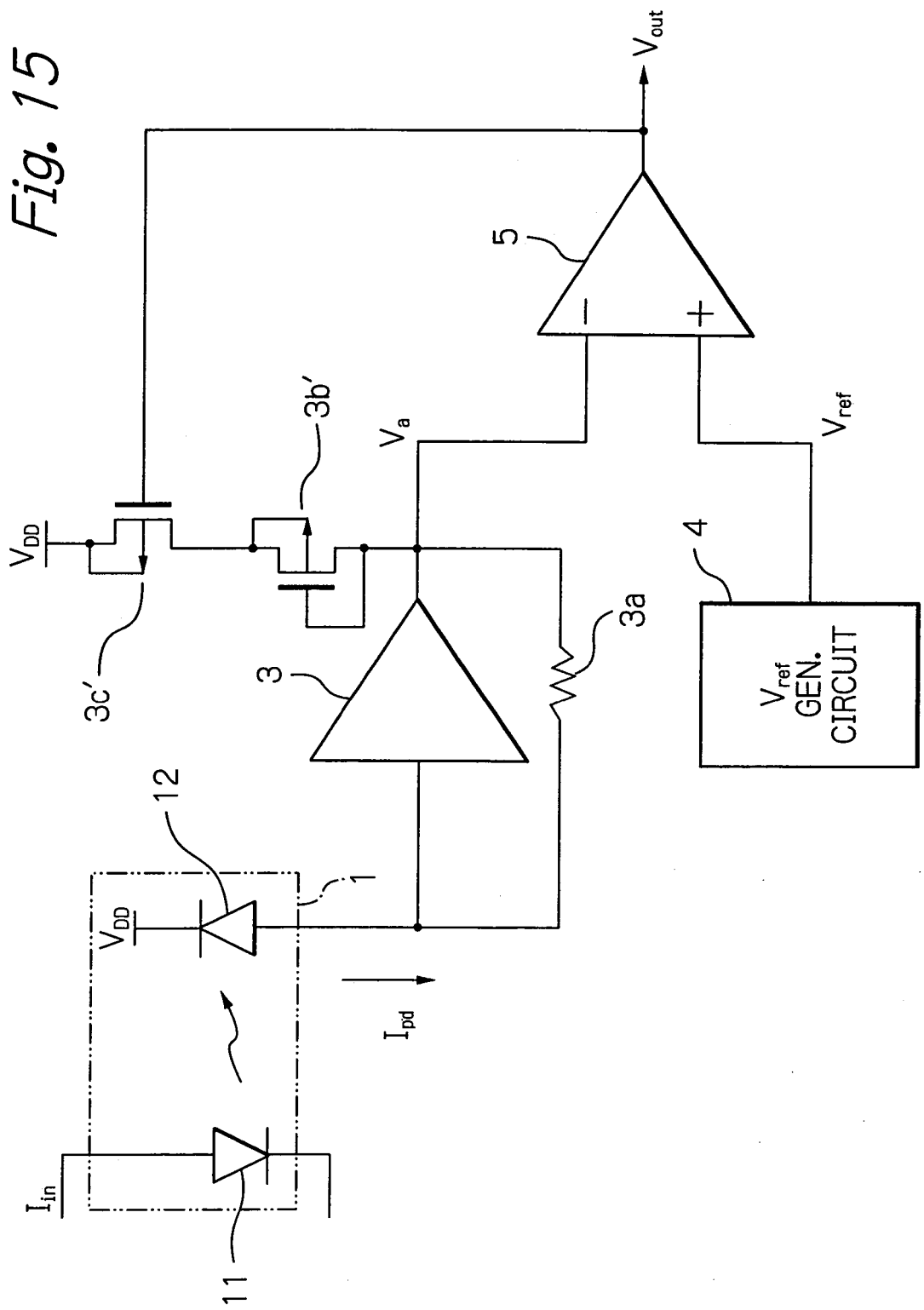
FIG. 15 is a circuit diagram illustrating a third embodiment of the signal determining apparatus according to the present invention.

In FIG. 15, which illustrates a third embodiment of the signal determining apparatus according to the present invention, the power supply voltage VDD and the ground voltage GND of FIG. 7 are interchanged with each other. In this case, the load N-channel MOS transistor 3b and the switching N-channel MOS transistor 3c of FIG. 7 are replaced by a load P-channel MOS transistor 3b' and a switching P-channel MOS transistor 3c', respectively. In this case, the amplifier 3 is constructed by P-channel MOS transistors instead of the N-channel MOS transistors 31, 33 and 35 of FIG. 2 (see: FIG. 7 of JP-2003-139608-A).

In FIG. 15, assume that the reference voltage $V_{ref}$ is relatively high, i.e., $V_{ref} \approx V_0$.

The operation of the signal determining apparatus of FIG. 15 will be explained next with reference to FIGS. 16A, 16B and 16C.

When the input current $I_{in}$ (or the photocurrent $I_{pd}$) is changed as illustrated in FIG. 16A, the output voltage $V_a$ of the amplifier 3 is changed as illustrated in FIG. 16B, and the output voltage $V_{out}$ of the comparator 5 is changed as illustrated in FIG. 16C.

In more detail, before time t1, the input current $I_{in}$ (the photocurrent $I_{pd}$) is zero, so that the output voltage $V_a$ of the amplifier 3 is $V_0$. In this case, the output voltage $V_{out}$ of the comparator 5 is low (="0"), so that the switching MOS transistor 3c' is turned ON. Therefore, the amplifier 3 with the load MOS transistor 3b' can operate at a low response speed.

At time t1, the input current $I_{in}$ (the photocurrent $I_{pd}$) rises to increase the output voltage $V_a$ of the amplifier 3.

Next, at time t2, the output voltage $V_a$ of the amplifier 3 reaches the reference voltage $V_{ref}$, so that the output voltage $V_{out}$ of the comparator 5 is switched from low (="0") to high (="1"). As a result, the switching MOS transistor 3c' is turned OFF, so that the amplifier 3 without the load MOS transistor 3b' can operate at a high response speed. In this case, although an undershoot phenomenon as indicated by Z1 in FIG. 16B appears in the output voltage $V_a$ of the amplifier 3, this undershoot phenomenon Z1 does not affect the output voltage $V_{out}$ of the comparator 5 due to the high reference voltage $V_{ref}$.

Next, at time t3, the input current $I_{in}$ (the photocurrent $I_{pd}$) falls to decrease the output voltage $V_a$ of the amplifier 3.

Next, at time t4, the output voltage $V_a$ of the amplifier 3 reaches the reference voltage $V_{ref}$, so that the output voltage $V_{out}$ of the comparator 5 is switched from high (="1") to low (="0"). As a result, the switching MOS transistor 3c' is turned ON, so that the amplifier 3 with the load MOS transistor 3b' can operate at a low response speed. Even in this case, an overshoot phenomenon as indicated by Z2' appears in the output voltage $V_a$ of the amplifier 3; however, this overshoot phenomenon Z2' is milder due to the low response speed of the amplifier 3. Therefore, this overshoot phenomenon Z2' in FIG. 16B does not affect the output voltage $V_{out}$ of the comparator 5.

Figure 17:
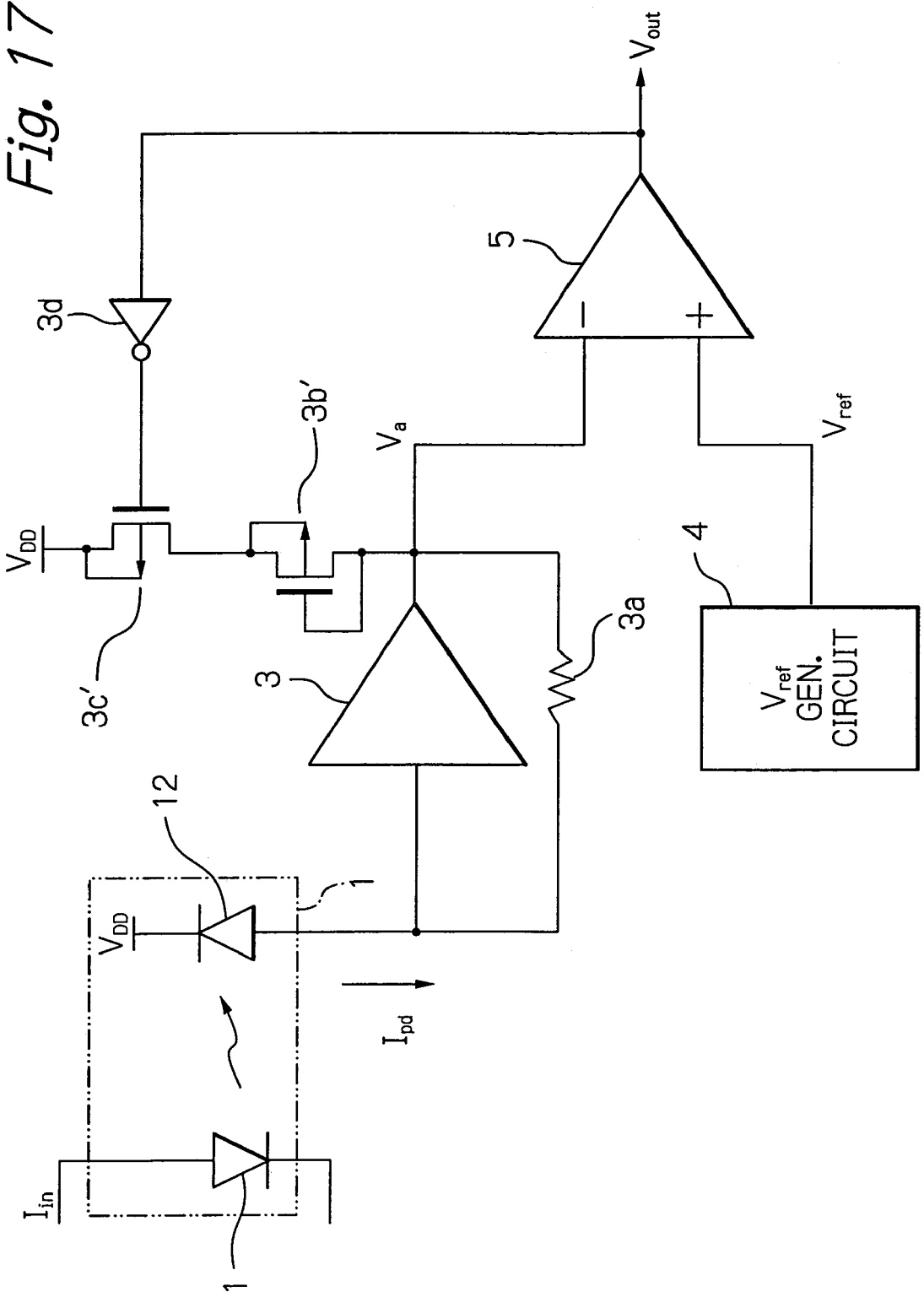
FIG. 17 is a circuit diagram illustrating a fourth embodiment of the signal determining apparatus according to the present invention.

In FIG. 17, which illustrates a fourth embodiment of the signal determining apparatus according to the present invention, an inverter 3d is connected between the output of the comparator 5 and the gate of the switching MOS transistor 3c' of FIG. 15. That is, when the output voltage $V_{out}$ of the comparator 5 is low (="0"), the switching MOS transistor 3c' is turned OFF to disconnect the load MOS transistor 3b' from the amplifier 3, so that the amplifier 3 with the load MOS transistor 3b' can operate at a high response speed. On the other hand, when the output voltage $V_{out}$ of the comparator 5 is high (="1"), the switching MOS transistor 3c' is turned ON to connect the load MOS transistor 3b' to the amplifier 3, so that the amplifier 3 with the load MOS transistor 3b' can operate at a low response speed.

In FIG. 17, assume that the reference voltage $V_{ref}$ is relatively low, i.e., $V_{ref} << V_0$.

The operation of the signal determining apparatus of FIG. 17 will be explained next with reference to FIGS. 18A, 18B and 18C.

Figure 18A:
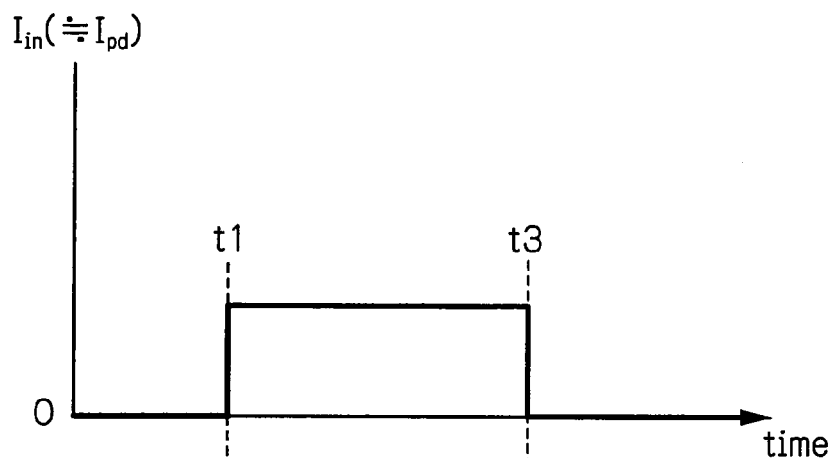
FIGS. 18A, 18B and 18C are timing diagrams for explaining the operation of the signal determining apparatus of FIG. 17.
Figure 18B:
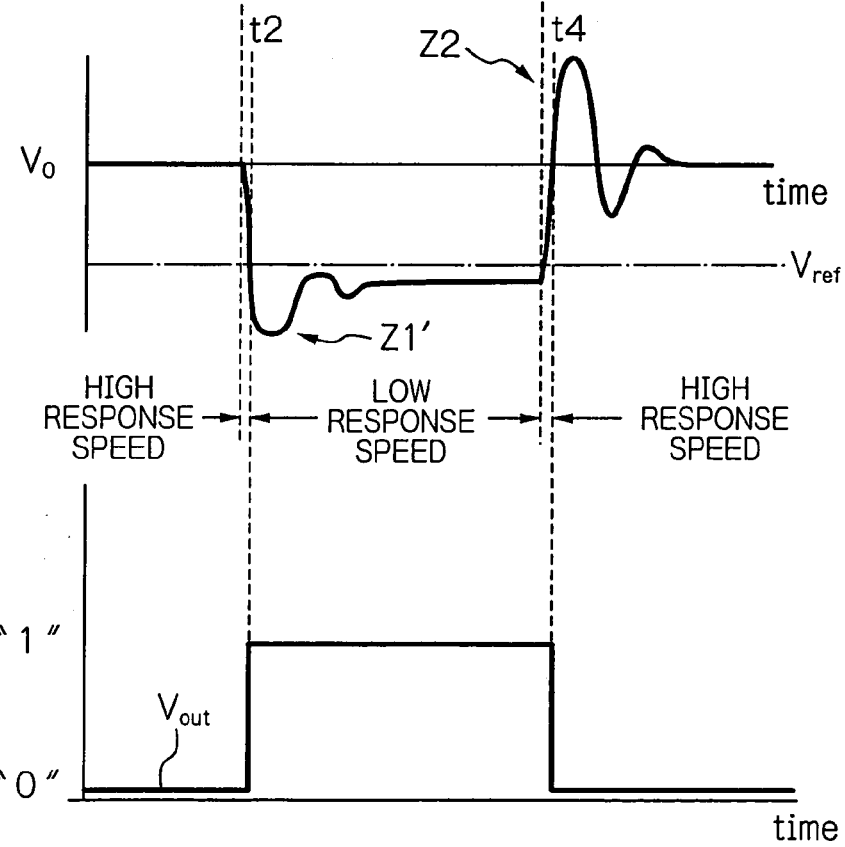
Figure 18C:
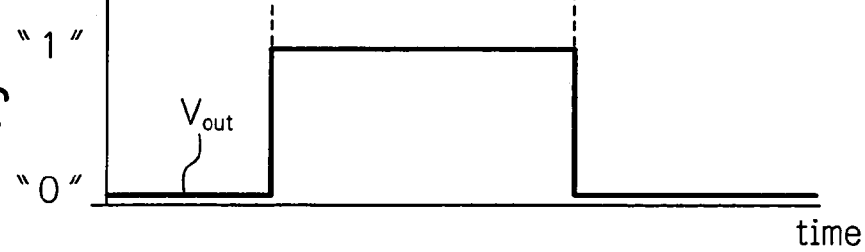

When the input current $I_{in}$ (or the photocurrent $I_{pd}$) is changed as illustrated in FIG. 18A, the output voltage $V_a$ of the amplifier 3 is changed as illustrated in FIG. 18B, and the output voltage $V_{out}$ of the comparator 5 is changed as illustrated in FIG. 18C.

In more detail, before time t1, the input current $I_{in}$ (the photocurrent $I_{pd}$) is zero, so that the output voltage $V_a$ of the amplifier 3 is $V_0$. In this case, the output voltage $V_{out}$ of the comparator 5 is low (="0"), so that the switching MOS transistor 3c' is turned OFF. Therefore, the amplifier 3 without the load MOS transistor 3b' can operate at a high response speed.

At time t1, the input current $I_{in}$ (the photocurrent $I_{pd}$) rises to increase the output voltage $V_a$ of the amplifier 3.

Next, at time t2, the output voltage $V_a$ of the amplifier 3 reaches the reference voltage $V_{ref}$, so that the output voltage $V_{out}$ of the comparator 5 is switched from low (="0") to high (="1"). As a result, the switching MOS transistor 3c' is turned ON, so that the amplifier 3 with the load MOS transistor 3b' can operate at a low response speed. In this case, although an undershoot phenomenon as indicated by Z1' in FIG. 18B appears in the output voltage $V_a$ of the amplifier 3, this undershoot phenomenon Z1' is milder due to the low response speed of the amplifier 3. Therefore, this undershoot phenomenon Z1' does not affect the output voltage $V_{out}$ of the comparator 5.

Next, at time t3, the input current $I_{in}$ (the photocurrent $I_{pd}$) falls to decrease the output voltage $V_a$ of the amplifier 3.

Next, at time t4, the output voltage $V_a$ of the amplifier 3 reaches the reference voltage $V_{ref}$, so that the output voltage $V_{out}$ of the comparator 5 is switched from high (="1") to low (="0"). As a result, the switching MOS transistor 3c' is turned OFF, so that the amplifier 3 without the load MOS transistor 3b' can operate at a high response speed. Even in this case, although an overshoot phenomenon as indicated by Z2 in FIG. 18B appears in the output voltage $V_a$ of the amplifier 3, this overshoot phenomenon Z2 does not affect the output voltage $V_{out}$ of the comparator 5 due to the low reference voltage $V_{ref}$. Even in FIGS. 15 and 17, the same modifications as illustrated in FIGS. 11 and 12 can be applied. That is, the feedback resistor 3a can be replaced by a series of two resistors, and the load MOS transistor 3b' can be replaced by a series of resistor and a capacitor connected between a node of the above-mentioned resistors and the switching MOS transistor.

Further, in FIGS. 15 and 17, the same modifications as illustrated in FIGS. 13 and 14 can be applied.

Figure 19:
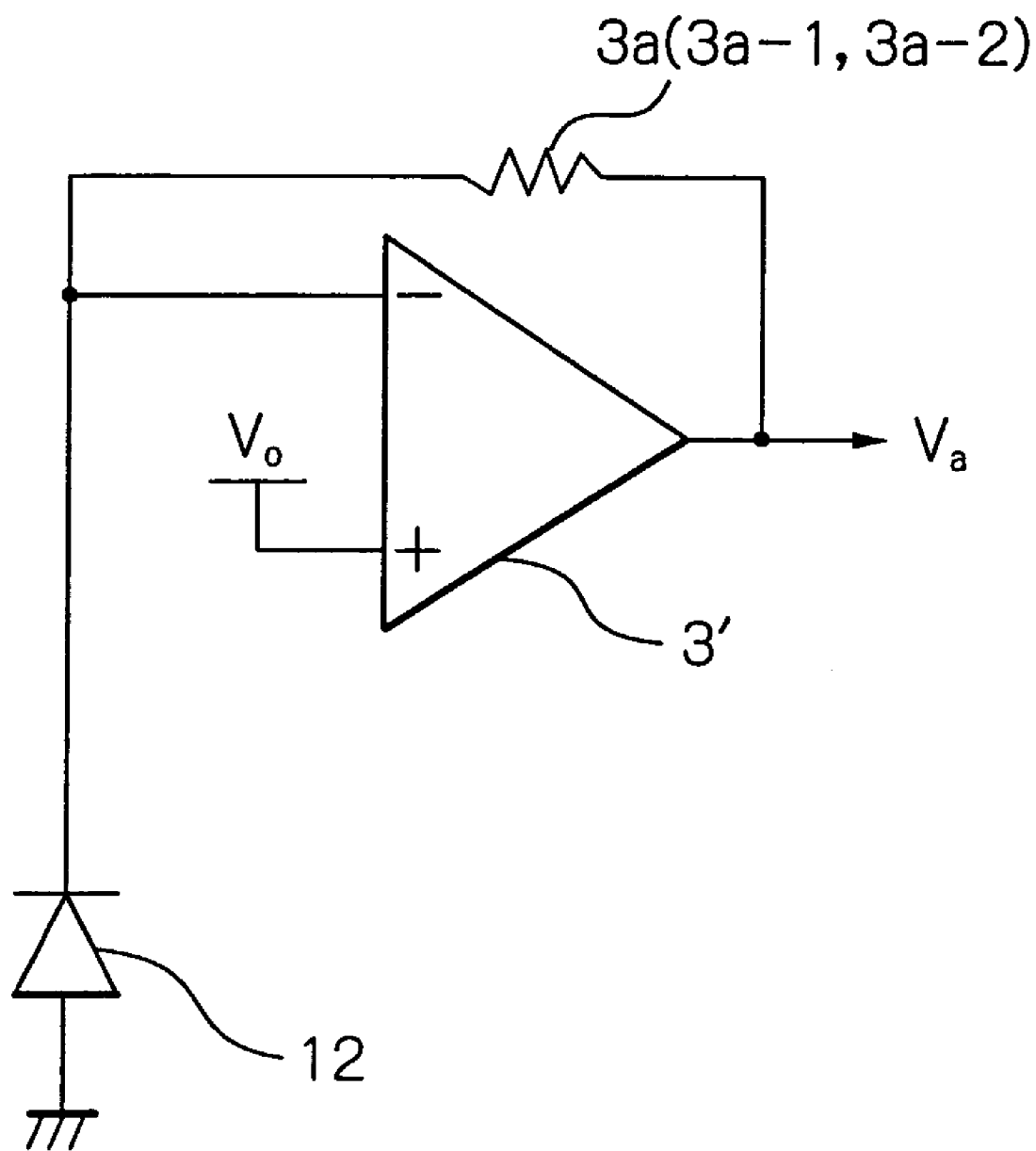
FIG. 19 is a circuit diagram illustrating a modification of the amplifier of FIGS. 7, 9, 11, 12, 13, 14, 15 and 17.

Also, the amplifier 3 can be constructed by an operational amplifier 3' as illustrated in FIG. 19 where the definite voltage $V_0$ is applied to a non-inverting input.

Note that the present invention can be applied to other signal determining apparatuses for inputting differential signals other than photocurrent signals.

As explained hereinabove, according to the present invention, the generation of spurious waveforms can be suppressed, which can prevent inviting a malfunction.

The invention claimed is:
1. A signal determining apparatus comprising:
an amplifier circuit adapted to receive and amplify an input signal to generate an output voltage; and a comparator connected to said amplifier circuit, said comparator adapted to compare the output voltage of said amplifier circuit with a reference voltage to generate an output signal, said amplifier circuit having variable response speed characteristics so that a response speed of said amplifier circuit is changed during its amplifying operation, wherein said amplifier circuit comprises a load circuit that comprises a load element and a switching element adapted to activate said load element, said switching element being turned ON and OFF in accordance with the output signal of said comparator.

2. The signal determining apparatus as set forth in claim 1, wherein said amplifier circuit comprises an amplifier whose output is connected to said load circuit.

3. The signal determining apparatus as set forth in claim 1, wherein said amplifier circuit comprises first and second feedback resistors, a node of said first and second feedback resistors being connected to said load circuit.

4. A signal determining apparatus comprising:
an amplifier circuit adapted to receive and amplify an input signal to generate an output voltage; and
a comparator connected to said amplifier circuit, said comparator adapted to compare the output voltage of said amplifier circuit with a reference voltage to generate an output signal,
said amplifier circuit having variable response speed characteristics so that a response speed of said amplifier circuit is changed during its amplifying operation,
wherein the response speed of said amplifier circuit is controlled in accordance with the output signal of said comparator, and
wherein said amplifier circuit comprises:
an amplifier adapted to receive and amplify said input signal;
a load circuit formed by a series of load element and a switching element, connected between an output of said amplifier and a power supply terminal, said switching element being controlled in accordance with the output signal of said comparator.

5. The signal determining apparatus as set forth in claim 4, wherein said load element comprises a diode connected MOS transistor.

6. The signal determining apparatus as set forth in claim 4, wherein said switching element comprises a MOS transistor whose gate voltage is controlled in accordance with the output signal of said comparator.

7. The signal determining apparatus as set forth in claim 4, wherein said amplifier circuit further comprises a negative feedback resistor connected between the output and input of said amplifier,
said amplifier adapted to generate a definite voltage when no input signal is received.

8. The signal determining apparatus as set forth in claim 7, further comprising a light receiving element connected to the input of said amplifier, said input signal being a photocurrent signal.

9. The signal determining apparatus as set forth in claim 4, wherein said amplifier comprises an operational amplifier which has an inverting input connected to said negative feedback resistor and a non-inverting input adapted to receive said definite voltage.

10. A signal determining apparatus comprising:
an amplifier circuit adapted to receive and amplify an input signal to generate an output voltage; and
a comparator connected to said amplifier circuit, said comparator adapted to compare the output voltage of said amplifier circuit with a reference voltage to generate an output signal,
said amplifier circuit having variable response speed characteristics so that a response speed of said amplifier circuit is changed during its amplifying operation,
wherein the response speed of said amplifier circuit is controlled in accordance with the output signal of said comparator, and
wherein said amplifier circuit comprises:
an amplifier having an input adapted to receive said input signal;
a series of two negative feedback resistors connected between the output and input of said amplifier;
a load circuit formed by a series of a load element and a switching element, connected to a node between said negative feedback resistors and a power supply terminal, said switching element being controlled in accordance with the output signal of said comparator.

11. The signal determining apparatus as set forth in claim 10, wherein said load element comprises a series of a resistor and a capacitor.

12. The signal determining apparatus as set forth in claim 10, wherein said switching element comprises a MOS transistor whose gate voltage is controlled in accordance with the output signal of said comparator.

13. The signal determining apparatus as set forth in claim 10, wherein said amplifier is adapted to generate a definite voltage when no input signal is received.

14. The signal determining apparatus as set forth in claim 10, further comprising a light receiving element connected to the input of said amplifier, said input signal being a photocurrent signal.

15. The signal determining apparatus as set forth in claim 10, wherein said amplifier comprises an operational amplifier which has an inverting input connected to the series of said negative feedback resistors and a non-inverting input adapted to receive said definite voltage.

16. A signal determining apparatus comprising;
an amplifier;
a feedback resistor connected between an output and an input of said amplifier;
a photodiode connected to the input of said amplifier;
a load circuit connected to the output of said amplifier and a power supply terminal, said load circuit comprising a series of a load element and a switching element; and
a comparator connected to the output of said amplifier, said comparator being adapted to compare an output voltage of said amplifier with a reference voltage to generate an output signal for controlling said switching element.

* * * * *